US010424723B2

(12) United States Patent
Boone et al.

(10) Patent No.: US 10,424,723 B2
(45) Date of Patent: Sep. 24, 2019

(54) MAGNETIC TUNNEL JUNCTION DEVICES INCLUDING AN OPTIMIZATION LAYER

(71) Applicant: Spin Transfer Technologies, Inc., Fremont, CA (US)

(72) Inventors: Thomas Boone, Fremont, CA (US); Pradeep Manandhar, Fremont, CA (US); Manfred Schabes, Fremont, CA (US); Bartlomiej Kardasz, Fremont, CA (US); Mustafa Pinarbasi, Fremont, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,249

(22) Filed: Dec. 29, 2017

(65) Prior Publication Data

US 2019/0207087 A1    Jul. 4, 2019

(51) Int. Cl.
*H01L 43/02* (2006.01)
*H01L 43/10* (2006.01)
*H01L 43/08* (2006.01)
*H01L 27/22* (2006.01)

(52) U.S. Cl.
CPC ............ *H01L 43/02* (2013.01); *H01L 27/222* (2013.01); *H01L 43/08* (2013.01); *H01L 43/10* (2013.01)

(58) Field of Classification Search
CPC ......... H01L 43/08; H01L 43/10; H01L 43/12; H01L 43/02; H01L 27/222
See application file for complete search history.

(56) References Cited

U.S. PATENT DOCUMENTS

| 4,597,487 A | 7/1986 | Crosby et al. |
| 5,541,368 A | 7/1996 | Prinz |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,346 A | 12/1997 | Lange et al. |
| 5,695,846 A | 12/1997 | Lange et al. |
| 5,695,864 A | 12/1997 | Zlonczweski |
| 5,732,016 A | 3/1998 | Chen |

(Continued)

FOREIGN PATENT DOCUMENTS

| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

*Primary Examiner* — Bilkis Jahan
*Assistant Examiner* — Victor V Barzykin

(57) ABSTRACT

A Magnetic Tunnel Junction (MTJ) device including pillar contacts coupling the free magnetic layer of cell pillars to a top contact. The pillar contacts are electrically isolated from one or more other portions of the cell pillar by one or more self-aligned sidewall insulators. The MTJ device further including one of a static magnetic compensation layer or an exchange spring layer in the cell pillar.

19 Claims, 3 Drawing Sheets

(56) References Cited

U.S. PATENT DOCUMENTS

| | | |
|---|---|---|
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West et al. |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,852,662 B2 | 12/2010 | Yang |
| 7,881,095 B2 | 2/2011 | Lu |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,737,137 B1 | 5/2014 | Choy et al. |
| 8,780,617 B2 | 7/2014 | Kang |
| 8,792,269 B1 | 7/2014 | Abedifard |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |
| 9,166,155 B2 | 10/2015 | Deshpande |
| 9,229,853 B2 | 1/2016 | Khan |
| 9,245,508 B2 | 1/2016 | Chen et al. |

(56) References Cited

U.S. PATENT DOCUMENTS

| | | | |
|---|---|---|---|
| 9,250,990 B2 | 2/2016 | Motwani |
| 9,263,667 B1 | 2/2016 | Pinarbasi |
| 9,298,552 B2 | 3/2016 | Leem |
| 9,299,412 B2 | 3/2016 | Naeimi |
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,817 B2 | 6/2016 | Kawai |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1* | 9/2016 | Annunziata ............ H01L 43/12 |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,508,456 B1 | 11/2016 | Shim |
| 9,548,445 B2 | 1/2017 | Lee et al. |
| 9,553,102 B2 | 1/2017 | Wang |
| 9,583,167 B2 | 2/2017 | Chung |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 10,163,479 B2 | 12/2018 | Yoha |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1* | 5/2007 | Yoshikawa ............ G11C 11/16 257/421 |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310691 A1 | 12/2011 | Zhou et al. |
| 2011/0320696 A1 | 12/2011 | Fee et al. |
| 2012/0028373 A1 | 2/2012 | Belen |
| 2012/0052258 A1 | 3/2012 | Op DeBeeck et al. |
| 2012/0069649 A1 | 3/2012 | Ranjan et al. |
| 2012/0127804 A1 | 5/2012 | Ong et al. |
| 2012/0155158 A1 | 6/2012 | Higo |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |

(56) References Cited

U.S. PATENT DOCUMENTS

| | | |
|---|---|---|
| 2012/0239969 A1 | 9/2012 | Dickens |
| 2012/0254636 A1 | 10/2012 | Tsukamoto et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1* | 4/2014 | Jan .................... H01L 43/10 257/421 |
| 2014/0103472 A1 | 4/2014 | Kent et al. |
| 2014/0136870 A1 | 5/2014 | Breternitz et al. |
| 2014/0149827 A1 | 5/2014 | Kim et al. |
| 2014/0151827 A1* | 6/2014 | Zhou ................ H01F 10/3286 257/421 |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1* | 9/2014 | Kang ................ H01L 21/31144 365/148 |
| 2014/0281284 A1 | 9/2014 | Block et al. |
| 2014/0289358 A1 | 9/2014 | Lindamood |
| 2014/0321196 A1 | 10/2014 | Ikeda |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim et al. |
| 2016/0027999 A1 | 1/2016 | Pinarbasi |
| 2016/0043304 A1* | 2/2016 | Chen .................... H01L 43/08 257/421 |
| 2016/0056072 A1 | 2/2016 | Arvin et al. |
| 2016/0087193 A1 | 2/2016 | Yoha |
| 2016/0085443 A1 | 3/2016 | Tomishima et al. |
| 2016/0085621 A1 | 3/2016 | Motwani |
| 2016/0086600 A1 | 3/2016 | Bauer et al. |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0268499 A1 | 9/2016 | You |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0085692 A1 | 12/2016 | Kwok |
| 2016/0358778 A1 | 12/2016 | Park et al. |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062712 A1 | 3/2017 | Choi et al. |
| 2017/0069837 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |

(56) References Cited

FOREIGN PATENT DOCUMENTS

| WO | 2009-080636 | 7/2009 |
|----|-------------|--------|
| WO | 2011-005484 | 1/2011 |
| WO | 2014-062681 | 4/2014 |

OTHER PUBLICATIONS

US 2016/0218273 A1, 06/2016, Pinarbasi (withdrawn)
Bhatti Sabpreet et al., "Spintronics Based Random Access Memory: a Review," Material Today, Nov. 2107, pp. 530-548, vol. 20, No. 9, Elsevier.
Helia Naeimi, et al., "STTRAM Scaling and Retention Failure," Intel Technology Journal, vol. 17, Issue 1, 2013, pp. 54-75 (22 pages).
S. Ikeda, et al., "A Perpendicular-Anisotropy CoFeB—MgO Magnetic Tunnel , Junction", Nature Materials, vol. 9, Sep. 2010, pp. 721-724 (4 pages).
R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp. 5419-5422 (4 pages).
K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).
Kirsten Martens, et al., "Thermally Induced Magnetic Switching in Thin Ferromagnetic Annuli", NSF grants PHY-0351964 (DLS), 2005, 11 pages.
Kristen Martens, et al., "Magnetic Reversal in Nanoscropic Ferromagnetic Rings", NSF grants PHY-0351964 (DLS) 2006, 23 pages.
"Magnetic Technology Spiritronics, Media and Interface", Data Storage Institute, R&D Highlights, Sep. 2010, 3 pages.
Daniel Scott Matic, "A Magnetic Tunnel Junction Compact Model for STT-RAM and MeRAM", Master Thesis University of California, Los Angeles, 2013, pp. 43.

\* cited by examiner

MAGNETIC TUNNEL JUNCTION DEVICES INCLUDING AN OPTIMIZATION LAYER

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIGS. 1A and 1B, a simplified diagram of a MTJ, in accordance with the convention art, is shown. The MTJ can include two magnetic layers 110, 120, and a tunneling barrier layer 130. One of the magnetic layers 110 can have a fixed magnetization polarization 140, while the polarization of the magnetization of the other magnetic layer 120 can switch between opposite directions 150, 160. Typically, if the magnetic layers have the same magnetization polarization 140, 150, the MTJ cell will exhibit a relatively low resistance value corresponding to a '1' bit state; while if the magnetization polarization between the two magnetic layers is antiparallel 140, 160 the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward Magnetic Tunnel Junction (MTJ) devices.

In one embodiment, a MTJ device can include a plurality of cell pillars. A cell pillar can include a reference magnetic layer, a tunneling barrier layer, a free magnetic layer, a static magnetic compensation layer, a hard mask capping layer, a first sidewall insulator, a pillar contact and a top contact. The tunneling barrier layer can be disposed on the reference magnetic layer. The free magnetic layer can be disposed on the tunneling barrier layer. The static magnetic compensation layer can be disposed on the free magnetic layer. The static magnetic compensation layer can be configured to compensate for one or more parasitic magnetic characteristics proximate the free magnetic layer. The hard mask capping layer can be disposed on the static magnetic compensation layer. The first sidewall insulator can be self-aligned to the cell pillar along the hard mask capping layer and the static magnetic compensation layer. The pillar contact can be self-aligned to the cell pillar. The pillar contact can be insulated from the hard mask capping layer and the static magnetic compensation layer by the first sidewall insulator. The pillar contact can be electrically coupled to the free magnetic layer, and the top contact can be electrically coupled to the pillar contact.

In another embodiment, a cell pillar of the MTJ device can include a reference magnetic layer, a tunneling barrier layer, a free magnetic layer, an exchange spring layer, a hard mask capping layer, a first sidewall insulator, a pillar contact and a top contact. The tunneling barrier layer can be disposed on the reference magnetic layer. The free magnetic layer can be disposed on the tunneling barrier layer. The exchange spring layer can be disposed on the free magnetic layer. The exchange spring layer can be configured to maintain a magnetic state of the free magnetic layer. The hard mask capping layer can be disposed on the exchange spring layer. The first sidewall insulator can be self-aligned to the cell pillar along the hard mask capping layer and the exchange spring layer. The pillar contact can be self-aligned to the cell pillar. The pillar contact can be insulated from the hard mask capping layer and the exchange spring layer by the first sidewall insulator. The pillar contact can be electrically coupled to the free magnetic layer, and the top contact can be electrically coupled to the pillar contact.

The static magnetic compensation layer or the exchange spring layer can be utilized to optimize the MTJ device. The pillar contacts can provide electrical coupling between the free magnetic layer and the top contact so that the static magnetic compensation layer or the exchange spring layer does not impact the over electrical resistance of the device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
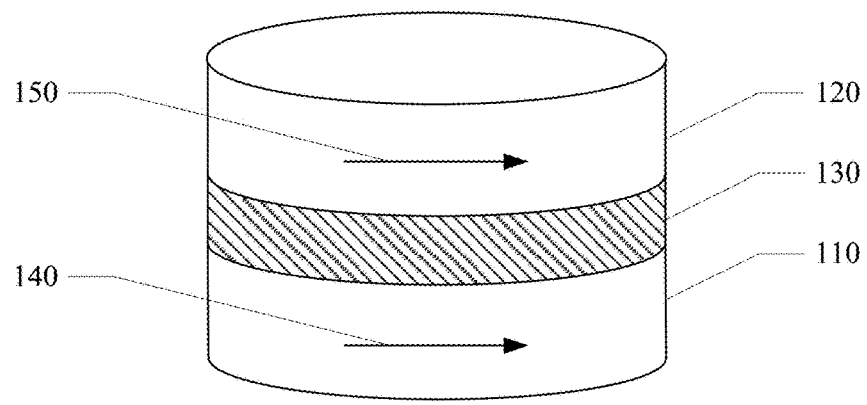
FIGS. 1A and 1B show a simplified diagram of a Magnetic Tunnel Junction (MTJ), in accordance with the convention art.
Figure 1B:
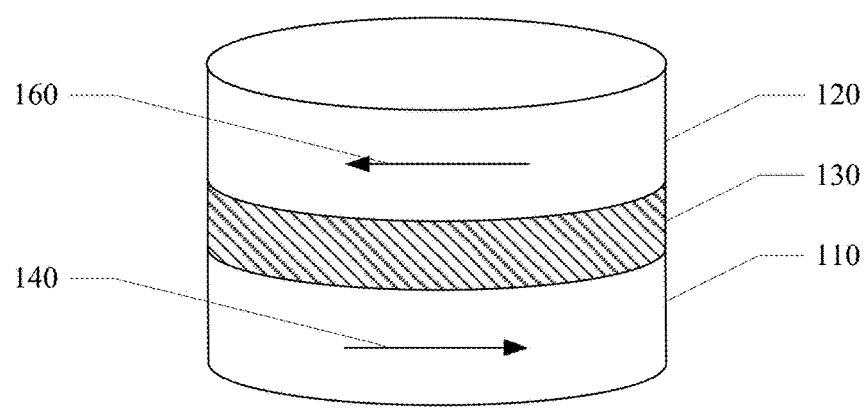

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
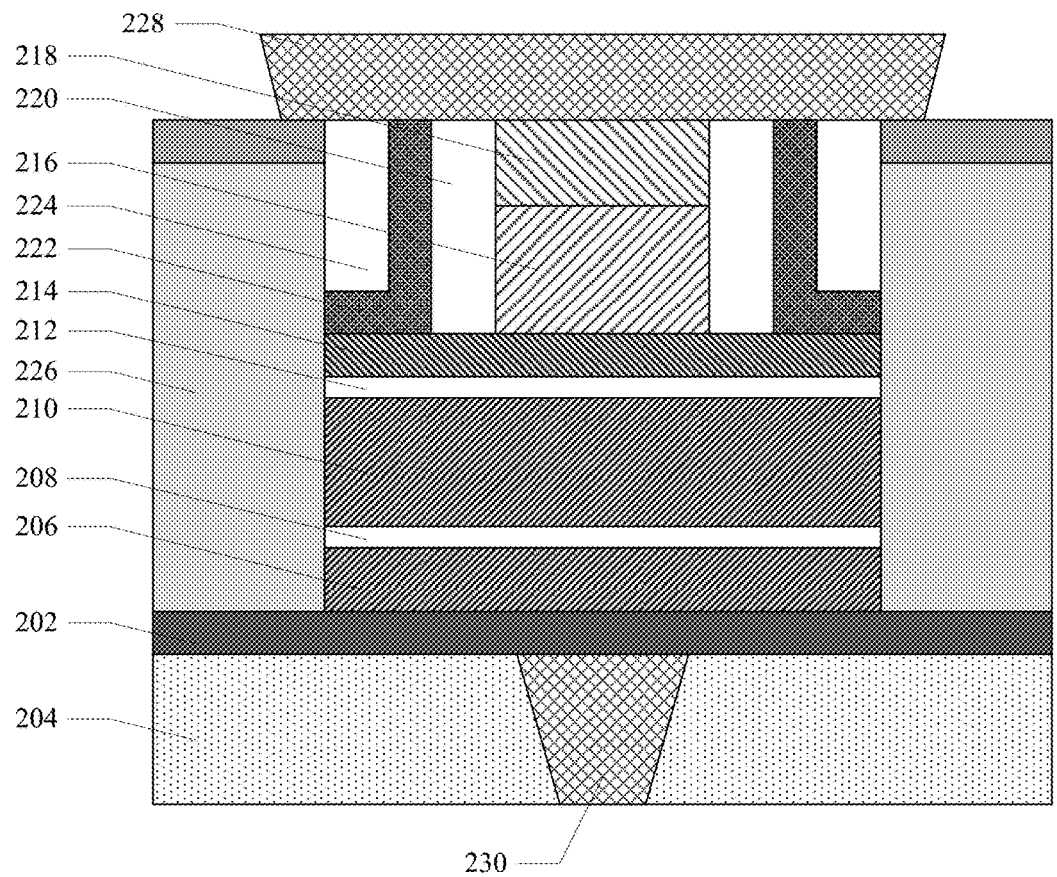
FIG. 2 shows a block diagram of a Magnetic Tunnel Junction (MTJ) device, in accordance with an embodiment of the present technology.

Referring now to FIG. 2, a block diagram of a Magnetic Tunnel Junction (MTJ) device, in accordance with an embodiment of the present technology, is shown. The MTJ device can include a plurality of cell pillars. In one aspect, the MTJ device can include one or more seed layers 202 disposed on a substrate 204. In one implementation, the seed layer 202 can include one or more layers of Tantalum (Ta) with a thickness of approximately 1-20 nanometers (nm), and the substrate 204 can be a silicon (Si) semiconductor wafer. In one instance the Tantalum (Ta) layer can be 5 nm thick.

In one aspect, a first ferromagnetic layer 206 of the cell pillars can be disposed on the seed layer 204. In one implementation, the first ferromagnetic layer 206 can include one or more layers of a Cobalt-Iron (Co—Fe), Cobalt Nickel (CoNi), or Cobalt Platinum (CoPt) alloy with a thickness of approximately 5-15 nm. A first non-magnetic layer 208 of the cell pillars can be disposed on the first ferromagnetic layer 206. In one implementation, the first non-magnetic layer 208 can include one or more layers of a Ruthenium (Ru) alloy with a thickness of approximately 30-100 nm. The first ferromagnetic layer 206, the first non-magnetic layer 208, and a subsequently described reference magnetic layer 210 can form a Synthetic Antiferromagnetic (SAF) 206-210 of the cell pillars.

In one aspect, a reference magnetic layer 210 of the cell pillar can be disposed on the first non-magnetic layer 208. In one implementation, the reference magnetic layer 210 can include one or more layers of a Cobalt-Iron-Boron (Co—Fe—B) alloy with a thickness of approximately 1-5 nm. A tunneling barrier layer 212 of the cell pillars can be disposed on the reference magnetic layer 210. In one implementation, the tunneling barrier layer 212 can include one or more layers of a Ruthenium (Ru) alloy with a thickness of approximately 0.1-1 nm. A free magnetic layer 214 of the cell pillars can be disposed on the non-magnetic tunneling barrier layer 212. In one implementation, the free magnetic layer 214 can include one or more layers of a Cobalt-Iron-Boron (Co—Fe—B) alloy with a thickness of approximately 0.5-2 nm.

In one aspect, the reference magnetic layer 210 in the cell pillars can have its magnetization pinned in a predetermined direction, meaning that the reference magnetic layer 210 has a higher coercivity than other layers and a larger magnetic field or spin-polarized current is needed to change the orientation of its magnetization. The magnetization direction of the free magnetic layer 214 in a given cell pillar can be changed by a smaller magnetic field or sin-polarized current relative to the reference magnetic layer 210. In one implementation, the magnetization vector of the first ferromagnetic layer 206 and the reference magnetic layer 210 can be substantially perpendicular (e.g., within several degrees) to a plane of the layers (e.g., along a z-axis). The magnetization vector of the free magnetic layer 214 can also be substantially perpendicular to the plane of the layer (e.g., along a z-axis), but its direction can vary by 180 degrees.

In one aspect, a static magnetic compensation layer 216 in the cell pillars can be disposed on the free magnetic layer 214. In one implementation, static magnetic compensation layer 216 can be disposed on a core portion of the free magnetic layer 214. The static magnetic compensation layer 216 can be a permanent magnet configured to provide a magnetic field in the free magnetic layer 214 that compensates for one or more parasitic magnetic fields in the free magnetic layer 214. In one implementation, the static magnetic compensation layer 216 can be configured to partially compensate for, balance out, or over compensate for the one or more parasitic magnetic field in the free magnetic layer 214. In one implementation, the static magnetic compensation layer can be Cobalt Platinum (CoPt) or Cobalt Iron (CoFe) with a thickness of approximately 0.5-5 nm.

In one aspect, one or more intermediate capping layers (not shown) in the cell pillars can optionally be disposed on the static magnetic compensation layer 216. The one or more intermediate capping layers can include one or more Perpendicular Magnetic Anisotropy (PMA) enhancement layers. Optionally, one or more intermediate capping layers can be disposed between the free magnetic layer 214 and the static magnetic compensation layer 216. In another option, one or more intermediate capping layers can be disposed between the free magnetic layer 214 and the static magnetic compensation layer 216, and one or more other intermediate capping layers can be disposed on the static magnetic compensation layer 216. The one or more intermediate capping layers formed between the free magnetic layer 214 and the static magnetic compensation layer 216, or on the static magnetic compensation layer 216 can include one or more Processional Spin Current (PSC) coupling layers, one or more Perpendicular Magnetic Anisotropy (PMA) enhancement layers, one or more PSC magnetic layers, or combinations of thereof. In one aspect, a hard mask capping layer 218 in the cell pillars can be disposed on the static magnetic compensation layer 216 or an optional intermediate capping layer. In one implementation, the hard mask capping layer can be Silicon Oxide (SiOx), a Silicon Nitride (SiNx) or Aluminum Oxide (AlOx) with a thickness of approximately 5-20 nm.

In one aspect, first sidewall insulators 220 can be self-aligned to the cell pillars along the hard mask capping layer 218 and the static magnetic compensation layer 216 of the cell pillars. In one implementation, the first sidewall insulators 220 can be silicon dioxide ($SiO_2$), silicon nitride (SiN), or the like with a thickness of approximately 5-10 nm. In one aspect, pillar contacts 222 can be self-aligned to the cell pillars. The pillar contacts can be insulated from the hard mask capping layer and the static magnetic compensation layer by the first sidewall insulators. The pillar contacts 222 can be coupled to the free magnetic layer. In one implementation, the pillar contacts 222 can be coupled along a periphery portion of the free magnetic layer. In one implementation, the pillar contacts can be Copper (Cu), Aluminum (Al), Ruthenium (Ru) with a thickness of approximately 5-20 nm. In one aspect, second sidewall insulators 224 can be self-aligned to the cell pillars along the pillar contacts 222 opposite the first sidewall insulators 222. In one implementation, the first sidewall insulators 220 can be silicon dioxide ($SiO_2$), silicon nitride (SiN), or the like with a thickness of approximately 4-8 nm.

In one aspect, a fill 226 can be disposed between the plurality of cell pillars. In one implementation, the fill 226 can be Silicon Oxide (SiOx) or Silicon Nitride (SiNx). In one aspect, top contacts can 228 can be disposed on the cell pillars. The top contacts can be coupled to the pillar contacts 222. The top contacts can also be coupled to the hard mask capping layer 218. In one implementation, the top contacts can be coupled to the free magnetic layer 212 through the pillar contacts 222, and to the free magnetic layer 212 through the hard mask capping layer 218, the one or more intermediate capping layers if included, and the static magnetic compensation layer 216. In one implementation, the top contacts can be Copper (Cu) or Aluminum (Al) with a thickness of approximately 25 nm. In one aspect, a bottom contact 230 can be disposed through the substrate 204. The bottom contact 230 can be coupled to the first ferromagnetic layer 206 in the cell pillars. In one implementation, the bottom contacts can be Copper (Cu) or Aluminum (Al).

The static magnetic compensation layer 216 configured to compensate for one or more parasitic magnetic fields in the free magnetic layer 212 can advantageously provide additional magnetic factors to assist the optimization of MTJ device without impacting the overall electrical resistance of the device. The static magnetic compensation layer does not deleteriously impact the overall electric resistance because electrical coupling between the top contact 228 and the free magnetic layer 212 is through the pillar contacts 222. In addition, the pillar contacts 222 can advantageously be electrical isolated from the upper portions of the cell pillars by the first and second self-aligned sidewall insulators 220, 224.

Figure 3:
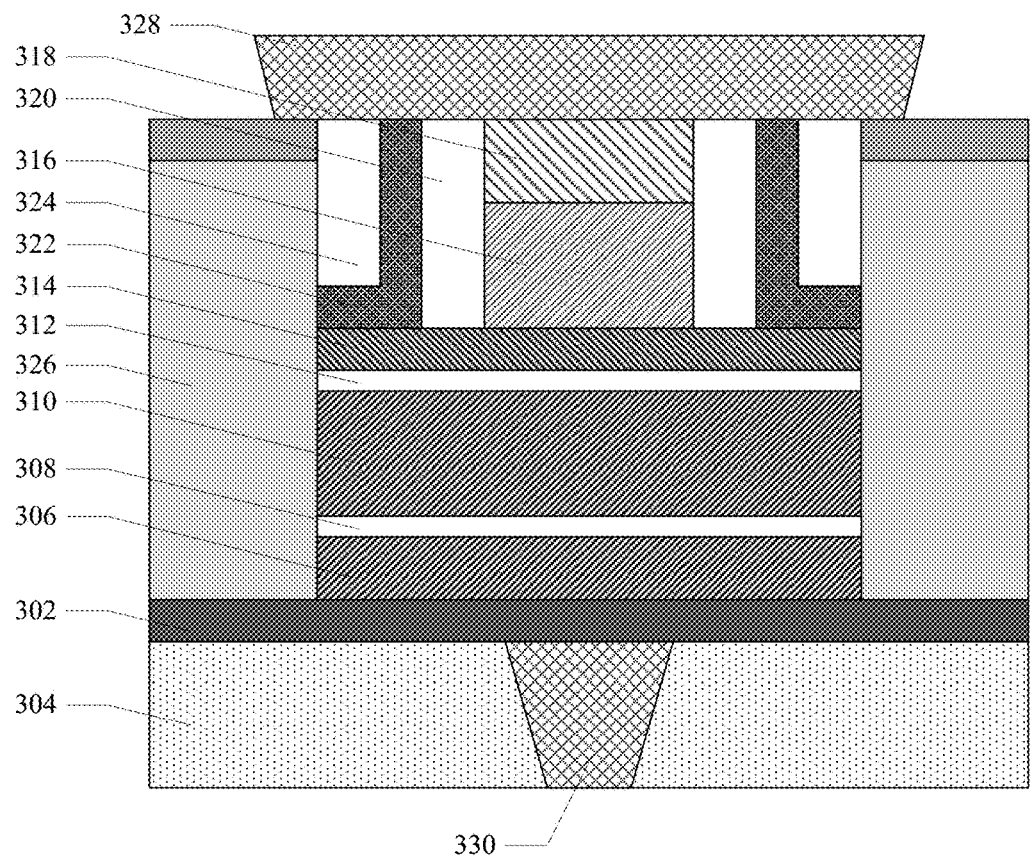
FIG. 3 shows a block diagram of a Magnetic Tunnel Junction (MTJ) device, in accordance with another embodiment of the present technology.

Referring now to FIG. 3, a block diagram of a Magnetic Tunnel Junction (MTJ) device, in accordance with an embodiment of the present technology, is shown. The MTJ device can include a plurality of cell pillars. In one aspect, the MTJ device can include one or more seed layers 302 disposed on a substrate 304. In one implementation, the seed layer 302 can include one or more layers of Tantalum (Ta) with a thickness of approximately 5 nanometers (nm), and the substrate 304 can be a silicon (Si) semiconductor wafer.

In one aspect, a first ferromagnetic layer 306 of the cell pillars can be disposed on the seed layer 304. In one implementation, the first ferromagnetic layer 306 can include one or more layers of a Cobalt-Iron (Co—Fe), Cobalt Nickel (CoNi), or Cobalt Platinum (CoPt) alloy with a thickness of approximately 5-15 nm. A first non-magnetic layer 308 of the cell pillars can be disposed on the first ferromagnetic layer 306. In one implementation, the first non-magnetic layer 308 can include one or more layers of a Ruthenium (Ru) alloy with a thickness of approximately 30-100 nm. The first ferromagnetic layer 306, the first non-magnetic layer 308, and a subsequently described reference magnetic layer 310 can form a Synthetic Antiferromagnetic (SAF) 306-310 of the cell pillars.

In one aspect, a reference magnetic layer 310 of the cell pillar can be disposed on the first non-magnetic layer 308. In one implementation, the reference magnetic layer 310 can include one or more layers of a Cobalt-Iron-Boron (Co—Fe—B) alloy with a thickness of approximately 1-5 nm. A tunneling barrier layer 312 of the cell pillars can be disposed on the reference magnetic layer 310. In one implementation, the tunneling barrier layer 312 can include one or more layers of a Ruthenium (Ru) alloy with a thickness of approximately 0.1-1 nm. A free magnetic layer 314 of the cell pillars can be disposed on the non-magnetic tunneling barrier layer 312. In one implementation, the free magnetic layer 314 can include one or more layers of a Cobalt-Iron-Boron (Co—Fe—B) alloy with a thickness of approximately 0.5-2 nm.

In one aspect, the reference magnetic layer 310 in the cell pillars can have its magnetization pinned in a predetermined direction, meaning that the reference magnetic layer 310 has a higher coercivity than other layers and a larger magnetic field or spin-polarized current is needed to change the orientation of its magnetization. The magnetization direction of the free magnetic layer 314 in a given cell pillar can be changed by a smaller magnetic field or sin-polarized current relative to the reference magnetic layer 310. In one implementation, the magnetization vector of the first ferromagnetic layer 306 and the reference magnetic layer 310 can be substantially perpendicular (e.g., within several degrees) to a plane of the layers (e.g., along a z-axis). The magnetization vector of the free magnetic layer 314 can also be substantially perpendicular to the plane of the layer (e.g., along a z-axis), but its direction can vary by 180 degrees.

In one aspect, an exchange spring layer 316 in the cell pillars can be disposed on the free magnetic layer 314. In one implementation, exchange spring layer 316 can be disposed on a core portion of the free magnetic layer 314. The exchange spring layer 316 can be a permanent magnet configured to provide a magnetic field in the free magnetic layer 314 that compensates for one or more parasitic magnetic fields in the free magnetic layer 314. In one implementation, the exchange spring layer 316 can be configured to partially compensate for, balance out, or over compensate for the one or more parasitic magnetic field in the free magnetic layer 314. In one implementation, the static magnetic compensation layer can be a Cobalt Platinum (CoPt) or Cobalt Iron (CoFe) with a thickness of approximately 0.5-5 nm.

In one aspect, one or more intermediate capping layers (not shown) in the cell pillars can optionally be disposed on the exchange spring layer 316. The one or more intermediate capping layers can include one or more one or more Perpendicular Magnetic Anisotropy (PMA) enhancement layers. Optionally, one or more intermediate capping layers can be disposed between the free magnetic layer 314 and the exchange sprint layer 316. In another option, one or more intermediate capping layers can be disposed between the free magnetic layer 314 and the exchange spring layer 316, and one or more other intermediate capping layers can be disposed on the exchange spring layer 316. The one or more intermediate capping layers formed between the free magnetic layer 314 and the exchange spring layer 316, or on the exchange spring layer 316 can include one or more Processional Spin Current (PSC) coupling layers, one or more Perpendicular Magnetic Anisotropy (PMA) enhancement layers, one or more PSC magnetic layers, or combinations of thereof. In one aspect, a hard mask capping layer 318 in the cell pillars can be disposed on the exchange spring layer 316 or an optional intermediate capping layer. In one implementation, the hard mask capping layer can be a Silicon Oxide (SiOx), a Silicon Nitride (SiNx) or Aluminum Oxide (AlOx) with a thickness of approximately 5-20 nm.

In one aspect, first sidewall insulators 320 can be self-aligned to the cell pillars along the hard mask capping layer 318 and the exchange spring layer 316 of the cell pillars. In one implementation, the first sidewall insulators 320 can be silicon dioxide (SiO$_2$), silicon nitride (SiN), or the like with a thickness of approximately 5-10 nm. In one aspect, pillar contacts 322 can be self-aligned to the cell pillars. The pillar contacts can be insulated from the hard mask capping layer and the static magnetic compensation layer by the first sidewall insulators. The pillar contacts 322 can be coupled to the free magnetic layer. In one implementation, the pillar contacts 322 can be coupled along a periphery portion of the free magnetic layer. In one implementation, the pillar contacts can be Copper (Cu), Aluminum (Al), Ruthenium (Ru) with a thickness of approximately 5-10 nm. In one aspect, second sidewall insulators 324 can be self-aligned to the cell pillars along the pillar contacts 322 opposite the first sidewall insulators 322. In one implementation, the first sidewall insulators 320 can be silicon dioxide (SiO$_2$), silicon nitride (SiN), or the like with a thickness of approximately 4-8 nm.

In one aspect, a fill 326 can be disposed between the plurality of cell pillars. In one implementation, the fill 326 can be Silicon Oxide (SiOx) or Silicon Nitride (SiNx). In one aspect, top contacts can 328 can be disposed on the cell pillars. The top contacts can be coupled to the pillar contacts 322. The top contacts can also be coupled to the hard mask capping layer 318. In one implementation, the top contacts can be coupled to the free magnetic layer 312 through the pillar contacts 322, and to the free magnetic layer 312 through the hard mask capping layer 318, the one or more intermediate capping layers if included, and the exchange spring layer 316. In one implementation, the top contacts can be Copper (Cu) or Aluminum (Al) with a thickness of approximately 25 nm. In one aspect, a bottom contact 330 can be disposed through the substrate 304. The bottom contact 330 can be coupled to the first ferromagnetic layer 306 in the cell pillars. In one implementation, the bottom contacts can be Copper (Cu) or Aluminum (Al).

The exchange spring layer 316 can be advantageously configured to maintain a magnetic state of the free magnetic layer. The exchange spring layer does not deleteriously impact the overall electric resistance because electrical coupling between the top contact 328 and the free magnetic layer 312 is through the pillar contacts 322. In addition, the pillar contacts 322 can advantageously be electrical isolated from the upper portions of the cell pillars by the first and second self-aligned sidewall insulators 320, 324.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A Magnetic Tunnel Junction (MTJ) device comprising:
   a reference magnetic layer of a cell pillar;
   a tunneling barrier layer of the cell pillar disposed on the reference magnetic layer;
   a free magnetic layer of the cell pillar disposed on the tunneling barrier layer;
   a static magnetic compensation layer of the cell pillar disposed on the free magnetic layer;
   a hard mask capping layer of the cell pillar disposed on the static magnetic compensation layer;
   a top contact disposed on the hard mask capping layer
   a first sidewall insulator self-aligned to the cell pillar, wherein the first sidewall insulator is disposed along the hard mask capping layer and the static magnetic compensation layer and disposed between the free magnetic layer and the top contact; and
   a pillar contact self-aligned to the cell pillar, insulated from the hard mask capping layer and the static magnetic compensation layer by the first sidewall insulator, and electrically coupled directly between the free magnetic layer and the top contact, wherein the pillar contact is coupled to the free magnetic layer along a periphery portion of the free magnetic layer.

2. The MTJ of claim 1, further comprising:
   a first ferromagnetic layer of the cell pillar; and
   a first non-magnetic layer of the cell pillar disposed between the first ferromagnetic layer and the reference magnetic layer.

3. The MTJ of claim 2, further comprising:
   a substrate; and
   a seed layer disposed between the substrate and the first ferromagnetic layer.

4. The MTJ of claim 3, further comprising:
   a bottom contact disposed through the substrate and electrically coupled to the reference magnetic layer.

5. The MTJ of claim 4, wherein the bottom contact is electrically coupled to the reference magnetic layer through the first ferromagnetic layer and the first non-magnetic layer.

6. The MTJ of claim 1, further comprising:
a fill disposed between a plurality of cell pillars.

7. The MTJ of claim 1, further comprising:
a second sidewall insulator self-aligned to the cell pillar along the pillar contact opposite the first sidewall insulator.

8. The MTJ of claim 1, wherein the top contact is electrically coupled to the free magnetic layer through the hard mask capping layer and the static magnetic compensation layer.

9. The MTJ of claim 1, wherein the static magnetic compensation layer is configured to compensate for one or more parasitic magnetic characteristics proximate the free magnetic layer.

10. A Magnetic Tunnel Junction (MTJ) device comprising:
a reference magnetic layer of a cell pillar;
a tunneling barrier layer of the cell pillar disposed on the reference magnetic layer;
a free magnetic layer of the cell pillar disposed on the tunneling barrier layer;
an exchange spring layer of the cell pillar disposed on the free magnetic layer;
a hard mask capping layer of the cell pillar disposed on the exchange spring layer;
a top contact disposed on the hard mask capping layer;
a first sidewall insulator self-aligned to the cell pillar, wherein the first sidewall insulator is disposed along the hard mask capping layer and the exchange spring layer and disposed between the free magnetic layer and the top contact;
a pillar contact self-aligned to the cell pillar, insulated from the hard mask capping layer and the exchange spring layer by the first sidewall insulator, and electrically coupled directly between the free magnetic layer and the top contact, wherein the pillar contact is coupled to the free magnetic layer along a periphery portion of the free magnetic layer.

11. The MTJ of claim 10, further comprising:
a first ferromagnetic layer of the cell pillar; and
a first non-magnetic layer of the cell pillar disposed between the first ferromagnetic layer and the reference magnetic layer.

12. The MTJ of claim 11, further comprising:
a substrate; and
a seed layer disposed between the substrate and the first ferromagnetic layer.

13. The MTJ of claim 12, further comprising:
a bottom contact disposed through the substrate and electrically coupled to the reference magnetic layer.

14. The MTJ of claim 13, wherein the bottom contact is electrically coupled to the reference magnetic layer through the first ferromagnetic layer and the first non-magnetic layer.

15. The MTJ of claim 10, further comprising:
a fill disposed between a plurality of cell pillars.

16. The MTJ of claim 10, further comprising:
a second sidewall insulator self-aligned to the cell pillar along the pillar contact opposite the first sidewall insulator.

17. The MTJ of claim 10, wherein the top contact is electrically coupled to the free magnetic layer through the hard mask capping layer and the exchange spring layer.

18. The MTJ of claim 10, wherein the exchange spring layer is magnetically softer than the reference magnetic layer and magnetically harder than the free magnetic layer.

19. The MTJ of claim 10, wherein the exchange spring layer is configured to maintain a magnetic state of the free magnetic layer.

* * * * *